(12) United States Patent
Yasukawa et al.

(10) Patent No.: US 9,653,495 B2
(45) Date of Patent: May 16, 2017

(54) METHOD OF MANUFACTURING DISPLAY DEVICE

(71) Applicant: Panasonic Liquid Crystal Display Co., Ltd., Himeji, Hyogo (JP)

(72) Inventors: Hironori Yasukawa, Hyogo (JP); Genshiro Kawachi, Hyogo (JP); Tomoya Kato, Hyogo (JP); Kazuo Kita, Hyogo (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 99 days.

(21) Appl. No.: 14/684,824

(22) Filed: Apr. 13, 2015

(65) Prior Publication Data

US 2015/0221675 A1 Aug. 6, 2015

Related U.S. Application Data

(63) Continuation of application No. PCT/JP2013/005302, filed on Sep. 6, 2013.

(30) Foreign Application Priority Data

Nov. 30, 2012 (JP) ................................. 2012-262217

(51) Int. Cl.
*H01L 21/00* (2006.01)
*H01L 27/12* (2006.01)
(Continued)

(52) U.S. Cl.
CPC .......... *H01L 27/127* (2013.01); *G02F 1/1368* (2013.01); *G02F 1/136227* (2013.01);
(Continued)

(58) Field of Classification Search
CPC ............... H01L 27/127; H01L 27/1222; H01L 29/66666; H01L 29/66969; H01L 29/7869;
(Continued)

(56) References Cited

U.S. PATENT DOCUMENTS

2007/0241332 A1 10/2007 Ochiai et al.
2009/0051274 A1* 2/2009 Hayashi .............. H01L 51/5253
313/504
(Continued)

FOREIGN PATENT DOCUMENTS

JP 2007-286086 11/2007
JP 2010-238869 10/2010
(Continued)

OTHER PUBLICATIONS

International Search Report, Nov. 26, 2013; PCT/JP2013/005302 (3 pages).

*Primary Examiner* — Xinning Niu
*Assistant Examiner* — Vu A Vu
(74) *Attorney, Agent, or Firm* — Hamre, Schumann, Mueller & Larson, P.C.

(57) ABSTRACT

A method of manufacturing a display device includes: forming a gate electrode on a substrate; forming a gate insulating film on the substrate; forming an oxide semiconductor on the substrate; forming a source electrode and a drain electrode on the substrate; forming a passivation film on the substrate; forming a common electrode on the substrate; forming an interlayer insulating film on the substrate; forming a pixel electrode on the substrate; forming an alignment film on the substrate; radiating UV-rays onto the oxide semiconductor; and heat-treating the oxide semiconductor irradiated with the UV-rays. The radiating UV-rays is performed after the forming an oxide semiconductor, and the
(Continued)

heat-treating is performed after the forming a passivation film.

5 Claims, 19 Drawing Sheets

(51) Int. Cl.
    *G02F 1/1368* (2006.01)
    *H01L 29/786* (2006.01)
    *H01L 29/66* (2006.01)
    *G02F 1/1362* (2006.01)
    *G02F 1/1343* (2006.01)

(52) U.S. Cl.
    CPC ...... *H01L 27/1222* (2013.01); *H01L 27/1225* (2013.01); *H01L 27/1266* (2013.01); *H01L 27/1292* (2013.01); *H01L 29/66666* (2013.01); *H01L 29/66969* (2013.01); *H01L 29/7869* (2013.01); *G02F 2001/134372* (2013.01)

(58) Field of Classification Search
    CPC ........... H01L 27/1225; G02F 1/136227; G02F 1/1368; G02F 2001/134372
    USPC .............................................. 257/40; 438/22
    See application file for complete search history.

(56) References Cited

U.S. PATENT DOCUMENTS

| | | |
|---|---|---|
| 2010/0253895 A1 | 10/2010 | Ochiai et al. |
| 2011/0159619 A1* | 6/2011 | Tsuji ............... H01L 27/1225 438/30 |
| 2011/0242471 A1 | 10/2011 | Ochiai et al. |
| 2011/0309363 A1* | 12/2011 | Misaki ............ G02F 1/13458 257/59 |
| 2013/0149798 A1 | 6/2013 | Tsuji et al. |
| 2014/0134795 A1 | 5/2014 | Mochizuki et al. |

FOREIGN PATENT DOCUMENTS

| | | |
|---|---|---|
| JP | 2011-022323 | 2/2011 |
| JP | 2011-150324 | 8/2011 |
| JP | 4982619 | 7/2012 |

* cited by examiner

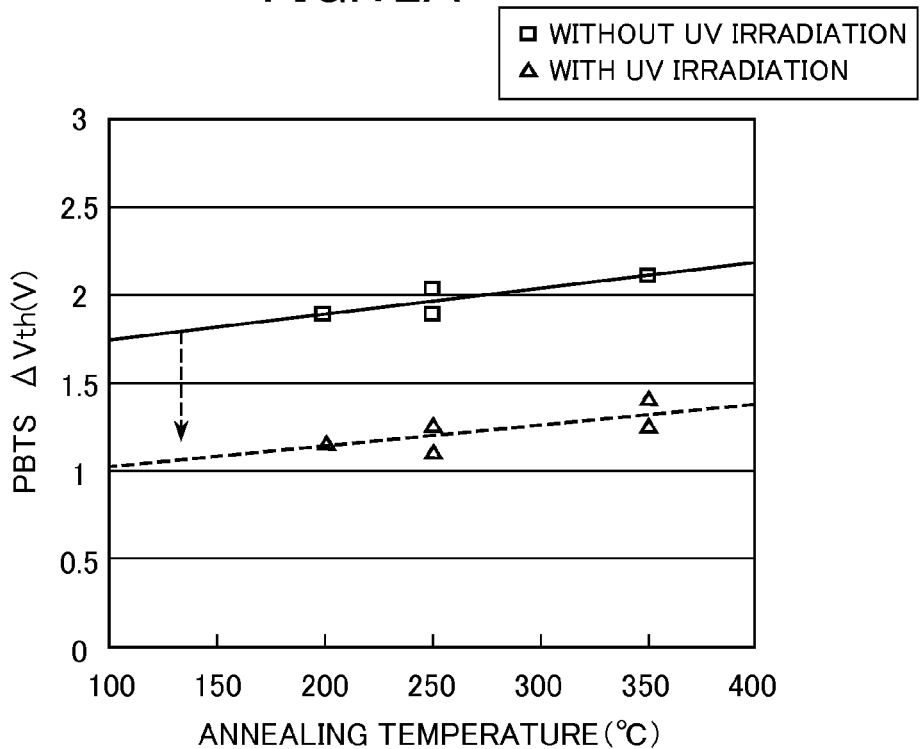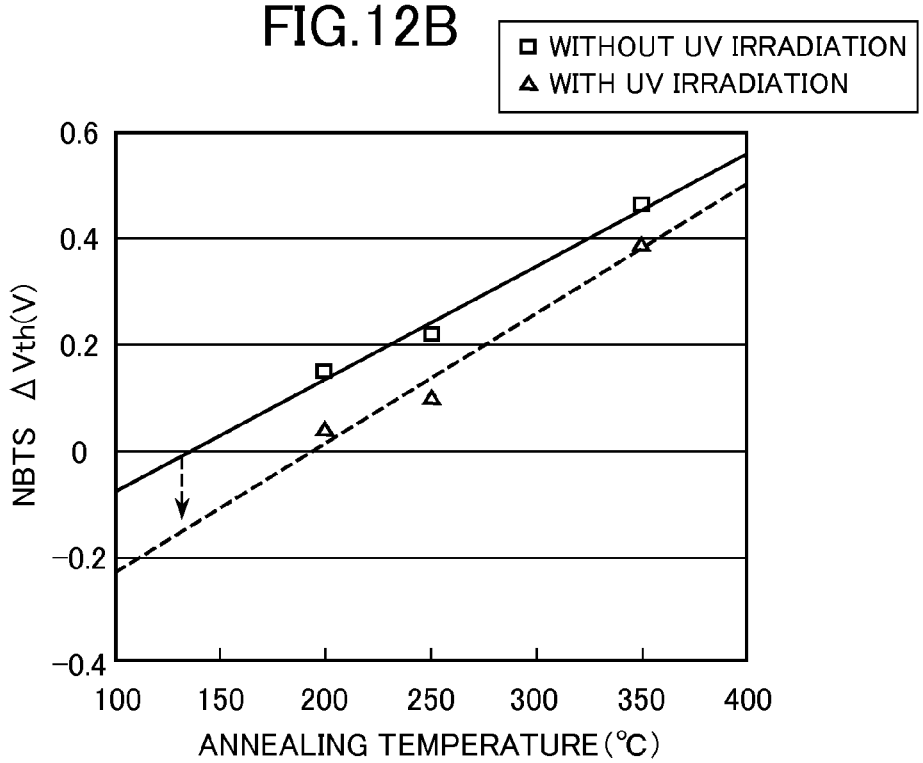

METHOD OF MANUFACTURING DISPLAY DEVICE

CROSS-REFERENCE TO RELATED APPLICATION

This application is Bypass Continuation of international patent application PCT/JP2013/005302, filed: Sep. 6, 2013 designating the United States of America, the entire disclosure of which is incorporated herein by reference. Priority is claimed based on Japanese patent application JP2012-262217, filed: Nov. 30, 2012. The entire disclosure of Japanese patent application JP2012-262217 is incorporated herein by reference in its entirety.

TECHNICAL FIELD

The present invention relates to a method of manufacturing a display device.

BACKGROUND

In recent years, thin-film transistors (TFTs) using an oxide semiconductor, for example, InGaZnO, are known. Specifically, for example, in Japanese Patent No. 4982619, a TFT using an oxide semiconductor for an active layer is disclosed. Further, the use of photoalignment for an alignment film to be formed on a TFT substrate is known (see Japanese Patent Application Laid-open No. 2010-238869).

SUMMARY

However, when a display panel is formed using the above-mentioned TFT that uses an oxide semiconductor, it is difficult to ensure the uniformity and reliability of the TFT characteristics. In particular, a shift in the threshold voltage of the TFT occurs when light is radiated, which causes the TFT characteristics and reliability to deteriorate.

In consideration of the above-mentioned problem, it is an object of one or more embodiments of the present invention to realize a method of manufacturing a display device including a TFT that uses an oxide semiconductor, the method being capable of stabilizing TFT characteristics and reducing a shift in the threshold voltage when light is radiated.

(1) A method of manufacturing a display device includes: forming a gate electrode on a substrate; forming a gate insulating film on the substrate having the gate electrode formed thereon; forming an oxide semiconductor on the substrate having the gate insulating film formed thereon; forming a source electrode and a drain electrode on the substrate having the oxide semiconductor formed thereon; forming a passivation film on the substrate having the source electrode and the drain electrode formed thereon; forming a common electrode on the substrate having the passivation film formed thereon; forming an interlayer insulating film on the substrate having the common electrode formed thereon; forming a pixel electrode on the substrate having the interlayer insulating film formed thereon; forming an alignment film on the substrate having the pixel electrode formed thereon; radiating UV-rays onto the oxide semiconductor; and heat-treating the oxide semiconductor irradiated with the UV-rays. The radiating UV-rays is performed after the forming an oxide semiconductor. The heat-treating is performed after the forming a passivation film.

(2) The method of manufacturing a display device according to (1), further includes bonding together the substrate and an opposing substrate opposing the substrate. The radiating UV-rays and the heat-treating the oxide semiconductor are performed before the bonding together the substrate and an opposing substrate opposing the substrate.

(3) In the method of manufacturing a display device according to (1) or (2), the radiating UV-rays is included in the forming an alignment film.

(4) In the method of manufacturing a display device according to (3), the forming an alignment film is performed by photoalignment.

(5) In the method of manufacturing a display device according to (1) or (2), the forming a passivation film includes: depositing the passivation film; and annealing the deposited passivation film. The radiating UV-rays is included in the annealing.

(6) In the method of manufacturing a display device according to (1) or (2), the forming a pixel electrode includes: depositing a transparent conductive film; and baking the transparent conductive film. The heat-treating the oxide semiconductor is included in the baking.

(7) In the method of manufacturing a display device according to (5) or (6), the forming an alignment film is performed by rubbing.

(8) In the method of manufacturing a display device according to any one of (1) to (7), the heat-treating is performed at a temperature of 200° C. or more.

(9) In the method of manufacturing a display device according to any one of (1) to (8), the heat-treating the oxide semiconductor irradiated with the UV-rays is performed using the UV-rays having a wavelength of from 200 to 400 nm.

(10) In the method of manufacturing a display device according to any one of (1) to (9), the heat-treating the oxide semiconductor irradiated with the UV-rays is performed under a state in which a cumulative amount of the UV-rays is from 50 mJ to 1,000 mJ.

(11) The method of manufacturing a display device according to any one of (1) to (10) further includes forming a channel protective film on the substrate having the oxide semiconductor formed thereon.

BRIEF DESCRIPTION OF THE DRAWINGS

FIG. 12A shows a relationship between an annealing temperature and a shift in a threshold voltage.

FIG. 12B shows a relationship between an annealing temperature and a shift in a threshold voltage.

DETAILED DESCRIPTION

Figure 1:
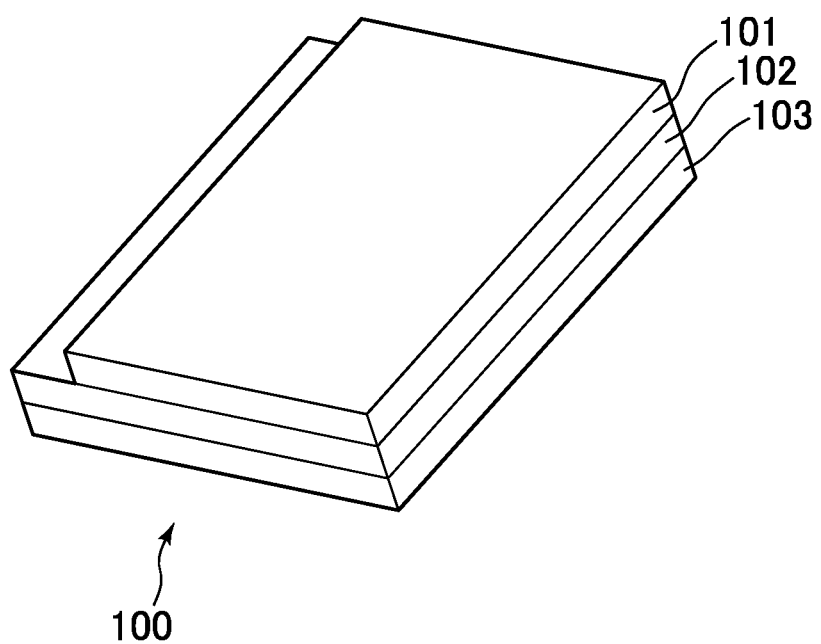
FIG. 1 is a schematic diagram illustrating a display device according to an embodiment of the present invention.

Referring to the accompanying drawings, an embodiment of the present invention is described below. In the drawings, the same or similar components are denoted by the same reference symbols, and repetitive description thereof is omitted.

FIG. 1 is a schematic diagram illustrating a display device according to an embodiment of the present invention. As illustrated in FIG. 1, a display device 100 includes, for example, a thin-film transistor (TFT) substrate 102 having a TFT and the like formed thereon (not shown), and a filter substrate 101 opposing the TFT substrate 102 and including a color filter (not shown) formed thereon. Further, the display device 100 includes a liquid crystal material (not shown) enclosed in a region sandwiched by the TFT substrate 102 and the filter substrate 101, and a backlight unit 103 positioned in contact with the side opposite to the filter substrate 101 side of the TFT substrate 102. Note that, this embodiment is not limited to the configuration of the display device 100 illustrated in FIG. 1, which is described here as an example.

Figure 2:
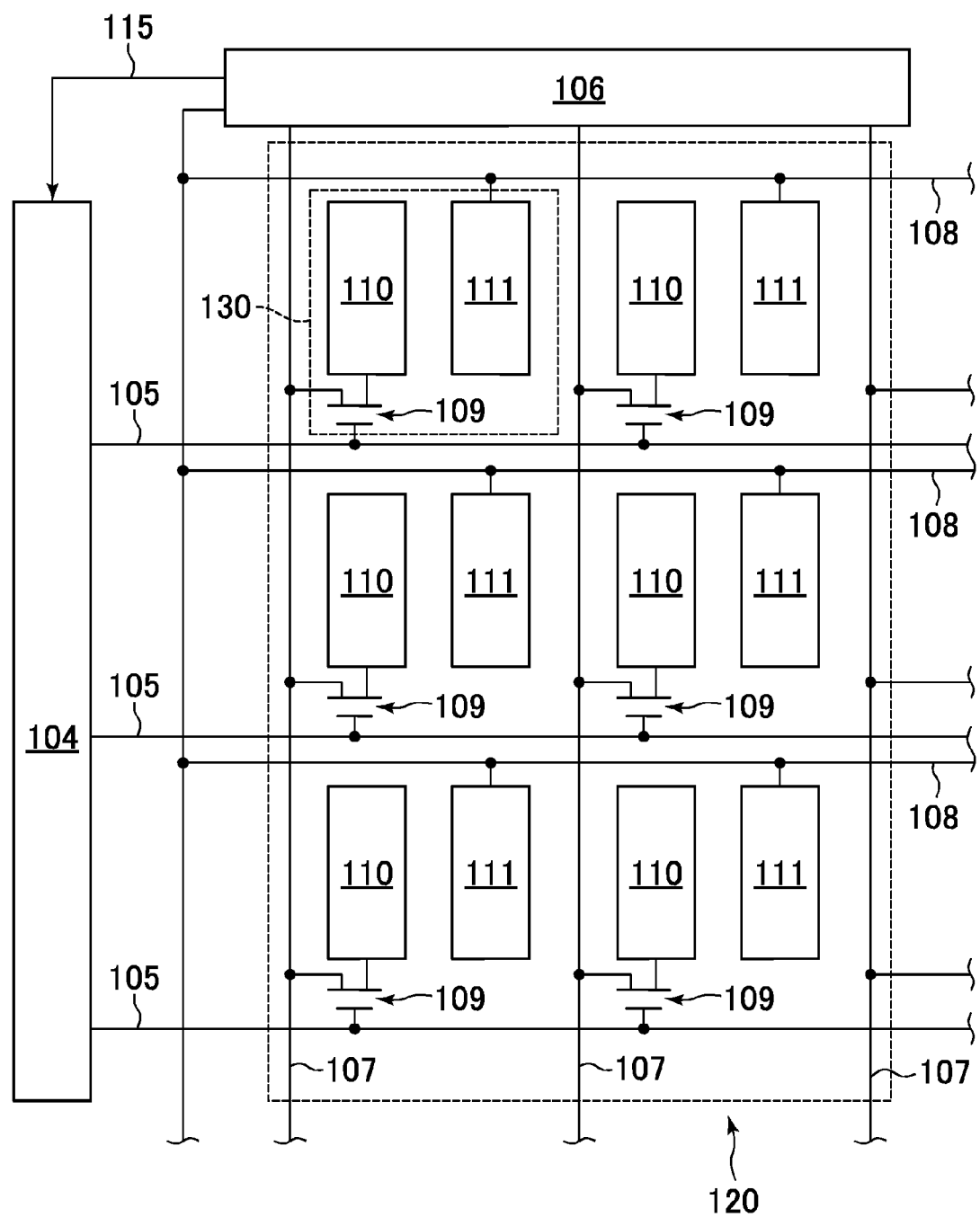
FIG. 2 is a conceptual diagram of a pixel circuit formed on a TFT substrate illustrated in FIG. 1.

FIG. 2 is a conceptual diagram of a pixel circuit formed on the TFT substrate illustrated in FIG. 1. As illustrated in FIG. 2, the TFT substrate 102 includes a plurality of gate lines 105 arranged at roughly equal intervals in a horizontal direction of FIG. 2 and a plurality of drain lines 107 arranged at roughly equal intervals in the vertical direction of FIG. 2.

The gate lines 105 are connected to a shift register circuit 104, and the drain lines 107 are connected to a driver 106.

The shift register circuit 104 includes a plurality of basic circuits (not shown) that respectively correspond to the plurality of gate lines 105. Each basic circuit includes a plurality of TFTs and capacitors. Based on a control signal 115 from the driver 106, within one frame period, a gate signal indicating a high voltage for a corresponding gate scanning period (signal high period) and a low voltage for other periods (signal low period) is output to the corresponding gate line 105.

Each of pixels 130, which have been subdivided into a matrix shape by the gate lines 105 and the drain lines 107, includes a TFT 109, a pixel electrode 110, and a common electrode 111. The gate of the TFT 109 is connected to the gate line 105. One of the source and the drain of the TFT 109 is connected to the drain line 107, and the other is connected to the pixel electrode 110. Further, the common electrode 111 is connected to a common signal line 108. The pixel electrode 110 and the common electrode 111 are arranged so as to oppose each other. The pixel electrodes 130 together form a pixel formation region 120.

Next, an outline of operation of the thus-configured pixel circuit is described. The driver 106 applies a reference voltage to the common electrode 111 via the common signal line 108. The shift register circuit 104 controlled by the driver 106 outputs a gate signal to the gate of the TFT 109 via the gate line 105. The driver 106 supplies via the gate line 105 a video signal voltage to the TFT 109 to which the gate signal has been output. The video signal voltage is applied to the pixel electrode 110 via the TFT 109. At this stage, a potential difference is produced between the pixel electrode 110 and the common electrode 111.

The alignment of the liquid crystal molecules of the liquid crystal material inserted between the pixel electrode 110 and the common electrode 111 is controlled by the driver 106 controlling this potential difference. In the liquid crystal material, light from the backlight unit 103 is guided. Therefore, by controlling the alignment and the like of the liquid crystal molecules in the above manner, the amount of light from the backlight unit 103 can be adjusted, and as a result, an image can be displayed.

Figure 3:
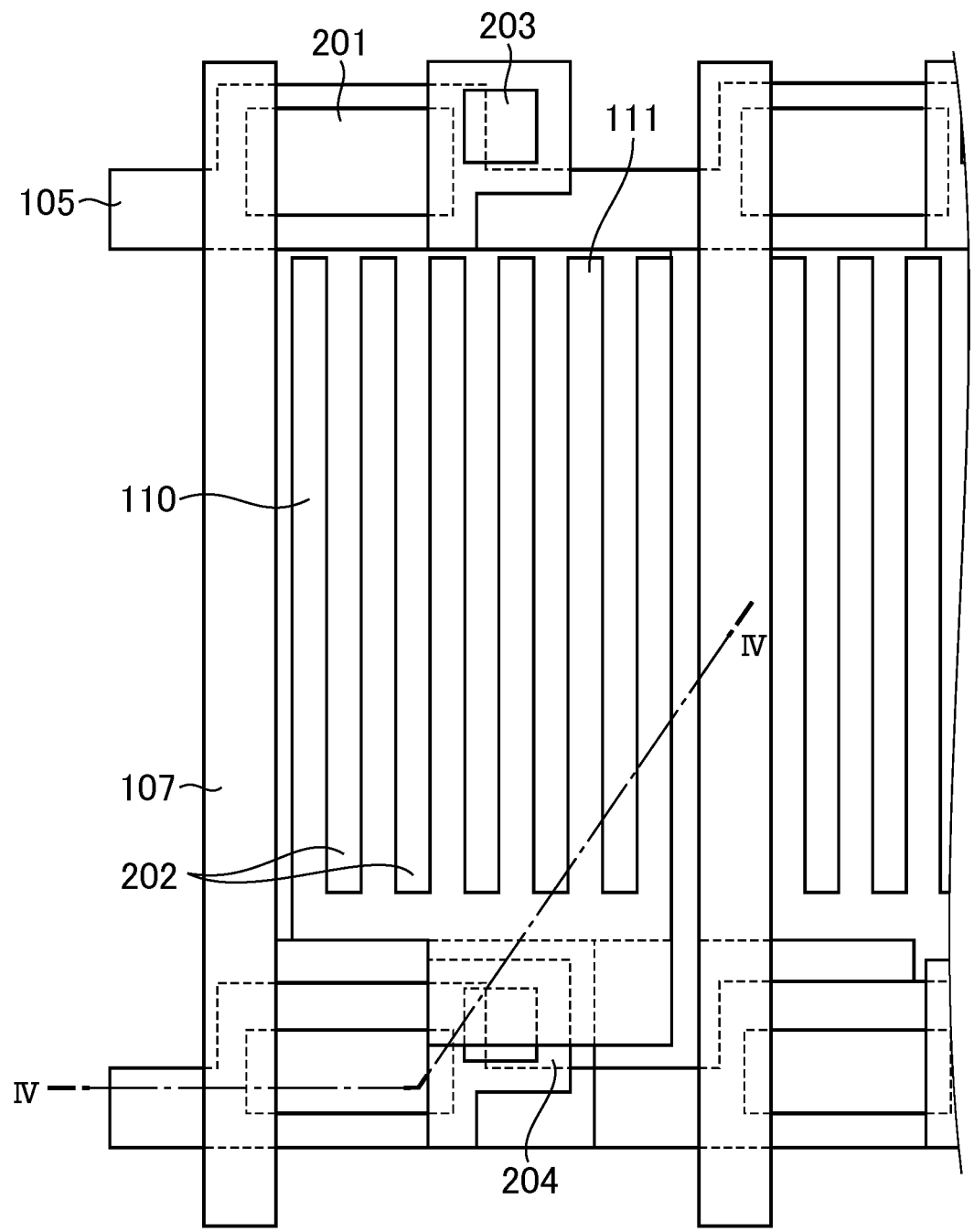
FIG. 3 illustrates an example of a configuration of a pixel illustrated in FIG. 2.

FIG. 3 illustrates an example of a configuration of the pixel illustrated in FIG. 2. As illustrated in FIG. 3, the common electrode 111 and the pixel electrode 110 are arranged in a pixel region, which is a region enclosed by the gate lines 105 and the drain lines 107 when viewed from above in FIG. 3.

As illustrated in FIG. 3, the pixel electrode 110 has a comb-tooth shape. The pixel electrode 110 is connected to a source electrode 204 via a through hole 203. This is described in more detail below. Note that, the shape of the pixel electrode 110 is not limited to a comb-tooth shape, which is described here as an example.

The TFT 109 is formed in a region of a portion of the gate line 105. Specifically, the TFT 109 is formed by laminating an oxide semiconductor 201 on a portion of the gate line 105 forming a gate electrode of the TFT 109, and by arranging the drain line 107 and the source electrode 204 so as to cover both ends of the oxide semiconductor layer. Note that, this embodiment is not limited to the pixel configuration illustrated in FIG. 3, which is described here as an example. Further, the TFT configuration and the pixel configuration are described in more detail below.

Figure 4:
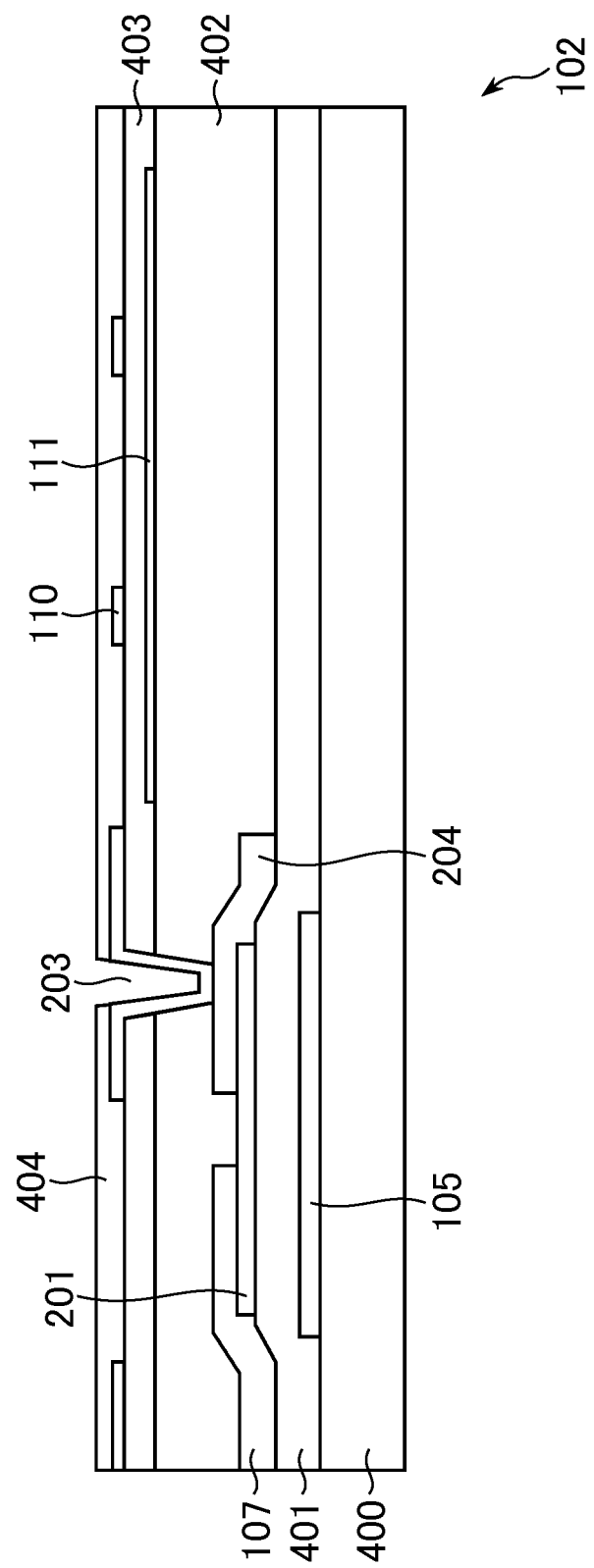
FIG. 4 illustrates an example of an outline of a cross-section taken along the line IV-IV in FIG. 3.

FIG. 4 illustrates an example of an outline of a cross-section taken along the line IV-IV in FIG. 3. As illustrated in FIG. 4, in a region in which the TFT 109 is formed, a substrate 400, the gate electrode 105, a gate insulating film 401, the oxide semiconductor 201, the drain electrode 107 and the source electrode 204, a passivation film 402, an interlayer insulating film 403, and an alignment film 404 are laminated in order from the bottom in FIG. 4.

Further, the through hole 203 is formed in an upper portion of the source electrode 204, and the source electrode 204 is connected to the pixel electrode 110 via this through hole 203.

In a region in which the pixel electrode 110 is formed, the substrate 400, the gate insulating film 401, the passivation film 402, the common electrode 111, the interlayer insulating film 403, the pixel electrode 110, and the alignment film 404 are laminated in order from the bottom in FIG. 4. As mentioned above, the pixel electrode 110 and the common electrode 111 are arranged opposing each other.

Note that, $SiO_2$, for example, is used as the material of the gate insulating film 401, the passivation film 402, and the interlayer insulating film 403. Further, ITO, for example, is used as the material of the pixel electrode 110 and the common electrode 111. It is desired that the gate insulating film 401, the passivation film 402, and the interlayer insulating film 403 be formed of an oxide material that is highly permeable to UV-rays having a wavelength of 400 nm or less, and be formed so as to cover an active layer of the oxide semiconductor 201.

Next, an outline of a cross-section when the filter substrate 101 is laminated on the thus-formed TFT substrate 102 is described. Note that, in the following description, because the configuration of the TFT substrate 102 is the same as the configuration described above, a description thereof is omitted here.

Figure 5:
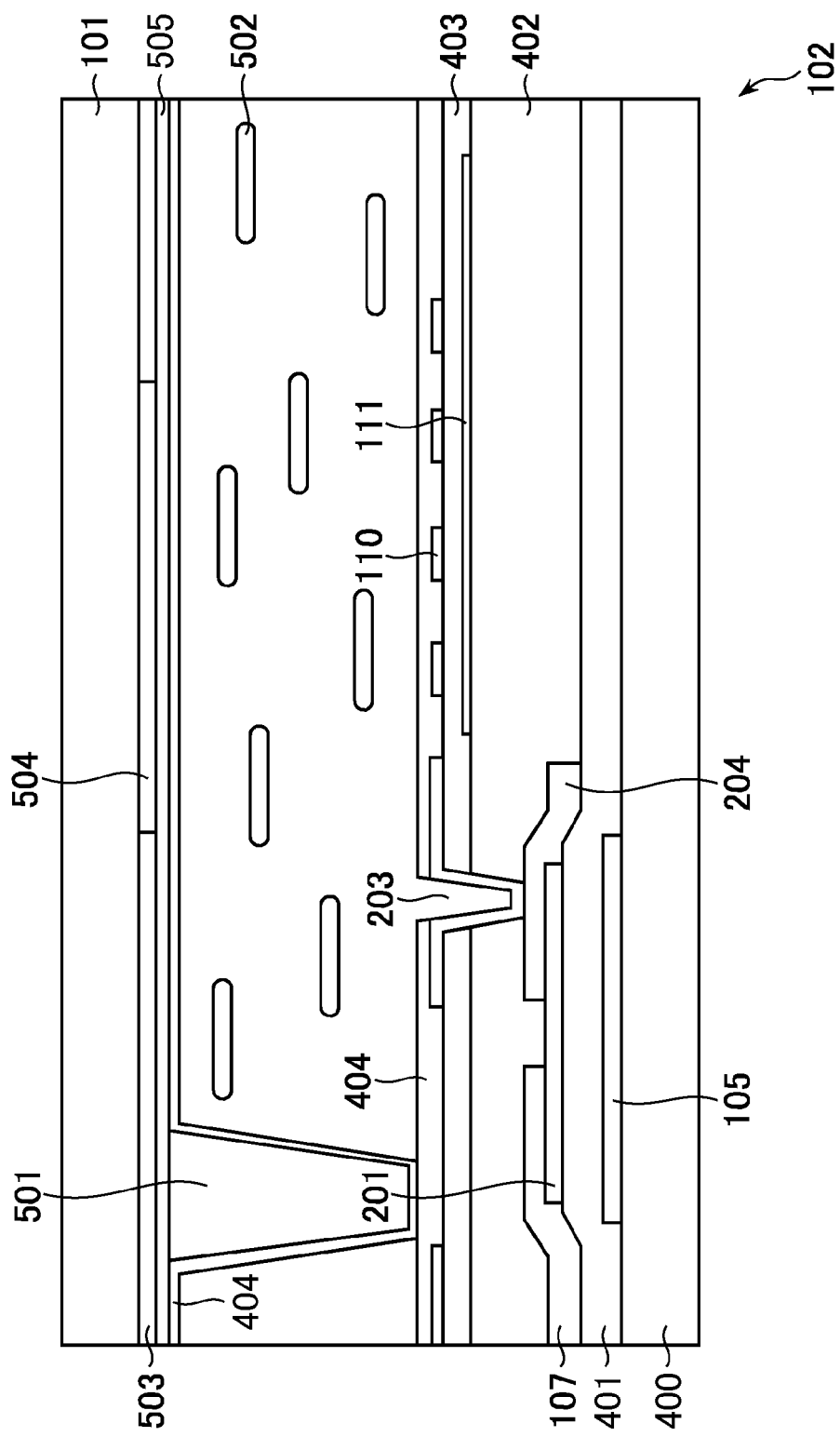
FIG. 5 illustrates an example of an outline of a cross-section when a filter substrate is laminated on the TFT substrate illustrated in FIG. 1.

As illustrated in FIG. 5, liquid crystal 502 is enclosed between the TFT substrate 102 and the filter substrate 101 with a spacer 501 formed between the TFT substrate 102 and the filter substrate 101. Specifically, when viewed from the filter substrate 101 side of FIG. 5, an overcoat film 505 and the alignment film 404 are arranged above the filter substrate 101, and the liquid crystal 502 is enclosed between this alignment film 404 and the alignment film 404 of the TFT substrate 102.

Further, a black matrix 503 of the filter substrate 101 is arranged above the spacer 501, and a color filter 504 is arranged above the pixel electrode 110. Further details about the configuration illustrated in FIG. 5 are well known, and hence a description thereof is omitted here. Note that, this embodiment is not limited to the configuration illustrated in FIG. 5, which is described here as an example.

Next, an example of an outline of a flow of a method of manufacturing the TFT substrate 102 is described with reference to FIGS. 6A to 6K and FIG. 7. Note that, this embodiment is not limited to the flow described below, which is described here as an example.

Figure 6A:
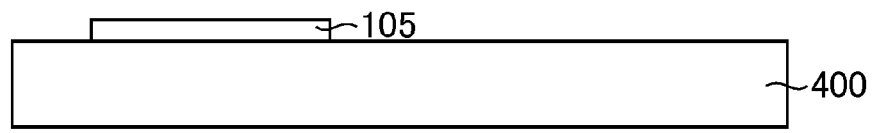
FIG. 6A illustrates an example of an outline of a flow of a method of manufacturing the TFT substrate.

First, as illustrated in FIG. 6A, the gate electrode 105 is formed on the substrate 400 (S101). Specifically, for example, a gate electrode layer for forming the gate electrode 105 is deposited on the substrate 400 using a sputtering apparatus. Then, using known photolithography technology, the gate electrode 105 is formed by processing the gate electrode 105 layer into an island shape. Note that, Cu, for example, is used for the gate electrode layer.

Figure 6B:
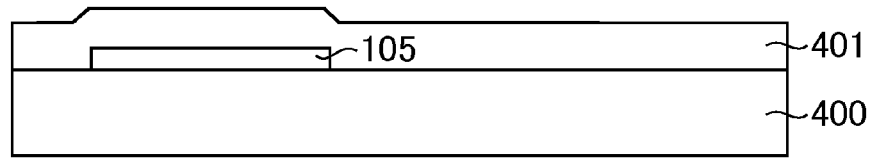
FIG. 6B illustrates an example of the outline of the flow of the method of manufacturing the TFT substrate.

Next, as illustrated in FIG. 6B, the gate insulating film 401 is formed on the substrate 400 having the gate electrode 105 formed thereon (S102). Specifically, for example, the gate insulating film 401 is deposited using a plasma-enhanced chemical vapor deposition (PECVD) apparatus. As the material of the gate insulating film 401, $SiO_2$ may be used, for example.

Figure 6C:
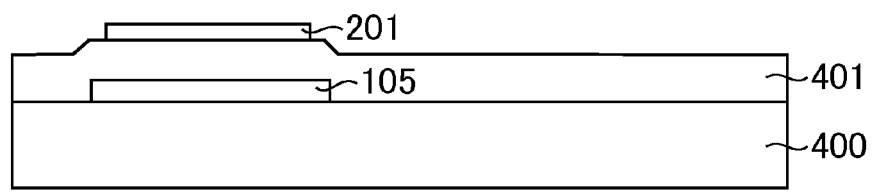
FIG. 6C illustrates an example of the outline of the flow of the method of manufacturing the TFT substrate.

Next, as illustrated in FIG. 6C, the oxide semiconductor 201 is formed on the substrate 400 having the gate insulating film 401 formed thereon (S103). Specifically, for example, the oxide semiconductor is deposited using a sputtering apparatus. Then, using known photolithography technology, the oxide semiconductor is processed into an island shape. As the oxide semiconductor, InGaZnO, an In—Zn oxide, an In—Sn oxide, and the like may be used.

Figure 6D:
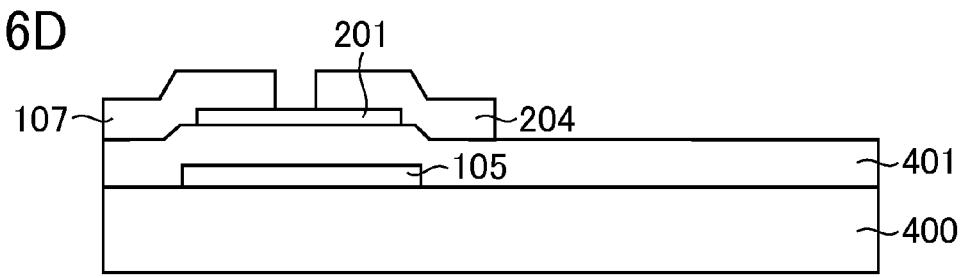
FIG. 6D illustrates an example of the outline of the flow of the method of manufacturing the TFT substrate.

Next, as illustrated in FIG. 6D, the source electrode 204 and the drain electrode 107 are formed on the substrate 400 having the oxide semiconductor 201 formed thereon (S104). Note that, using photolithography technology for the source electrode 204, the drain electrode 107, and the like is the same as described above. Cu, for example, is used for this electrode layer.

Figure 6E:
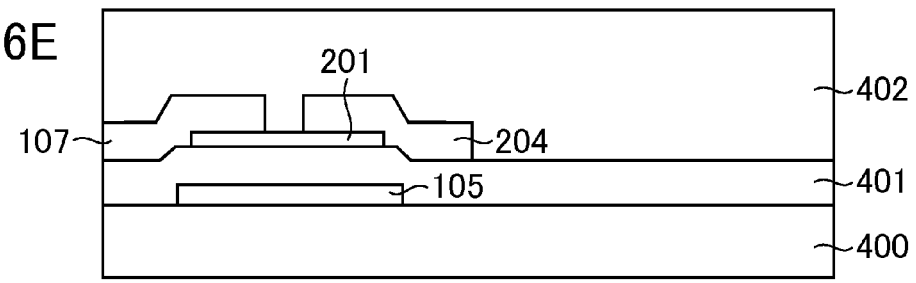
FIG. 6E illustrates an example of the outline of the flow of the method of manufacturing the TFT substrate.

Next, as illustrated in FIG. 6E, the passivation film 402 is formed on the substrate 400 having the source electrode 204 and the drain electrode 107 formed thereon (S105). Specifically, for example, the deposition of a silicon oxide film for forming the passivation film 402 with a PECVD apparatus is the same as described above, and hence a description thereof is omitted here. Further, as the material of the passivation film 402, $SiO_2$ may be used, for example.

Figure 6F:
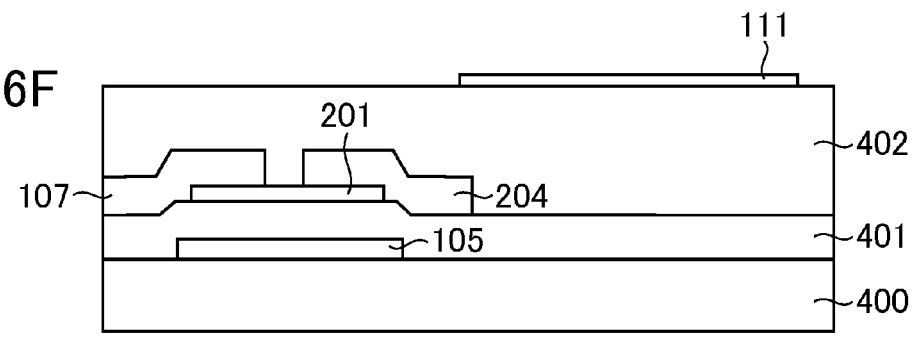
FIG. 6F illustrates an example of the outline of the flow of the method of manufacturing the TFT substrate.

Next, as illustrated in FIG. 6F, the common electrode 111 is formed on the substrate 400 having the passivation film 402 formed thereon (S106). Here, for example, a transparent conductive film (ITO) is used as the material of the common electrode 111.

Figure 6G:
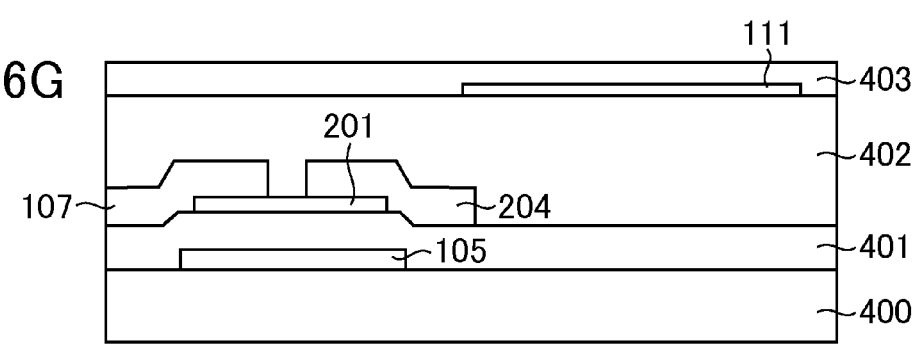
FIG. 6G illustrates an example of the outline of the flow of the method of manufacturing the TFT substrate.

Next, as illustrated in FIG. 6G, the interlayer insulating film 403 is formed on the substrate 400 having the common electrode 111 formed thereon (S107). Here, for example, $SiO_2$ is used for the interlayer insulating film 403. Further, at this stage, above the source electrode 204, the through hole 203 is formed by etching.

Figure 6H:
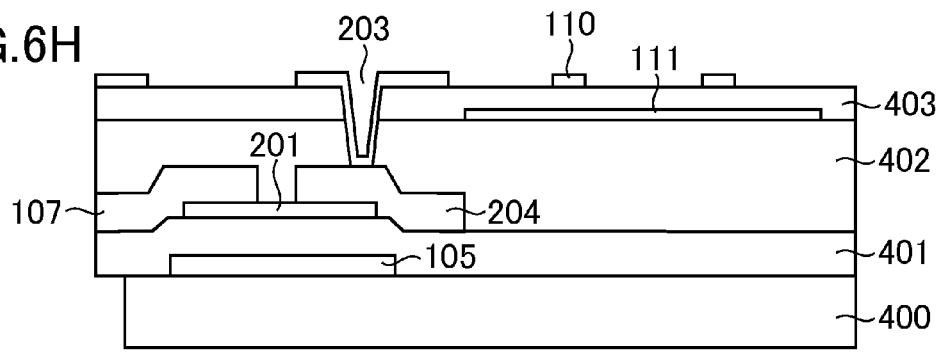
FIG. 6H illustrates an example of the outline of the flow of the method of manufacturing the TFT substrate.

Next, as illustrated in FIG. 6H, the pixel electrode 110 is formed on the substrate 400 having the interlayer insulating film 403 formed thereon (S108). Here, for example, ITO is used as the material of the pixel electrode 110. Further, at this stage, the pixel electrode 110 is connected to the oxide semiconductor 201 via the through hole 203.

Figure 6I:
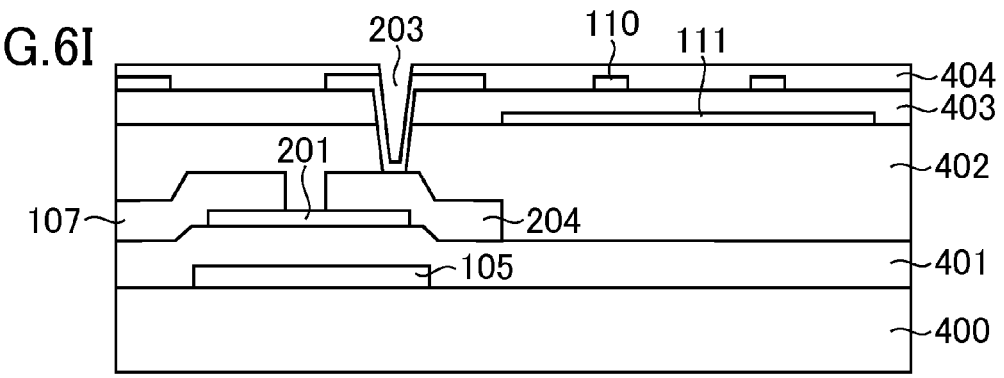
FIG. 6I illustrates an example of the outline of the flow of the method of manufacturing the TFT substrate.

Next, as illustrated in FIG. 6I, the alignment film 404 is formed on the substrate 400 having the pixel electrode 110 formed thereon (S109). Here, for example, photoalignment is used to form the alignment film 404.

Figure 6J:
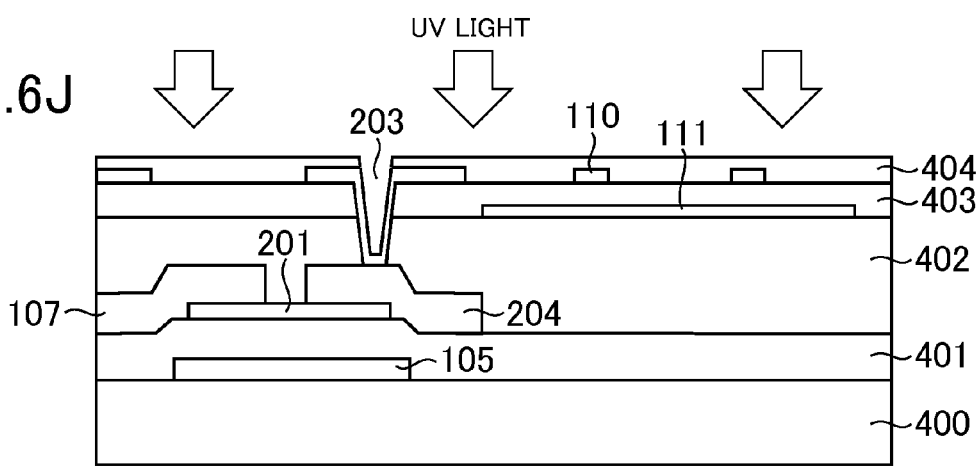
FIG. 6J illustrates an example of the outline of the flow of the method of manufacturing the TFT substrate.

Next, as illustrated in FIG. 6J, UV-rays are radiated onto the oxide semiconductor 201 (S110). Here, the UV-ray irradiation of Step S110 is carried out as an integrated process with the photoalignment performed in Step S109.

Figure 6K:
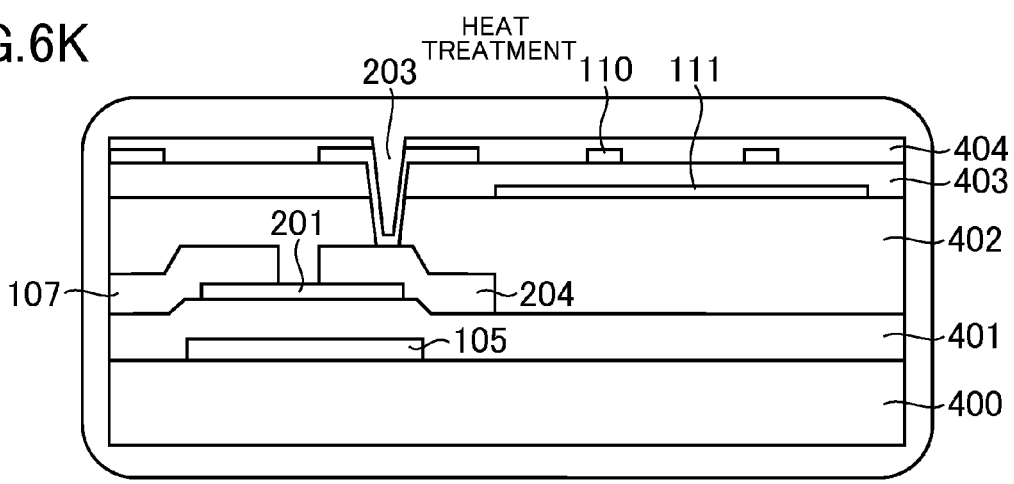
FIG. 6K illustrates an example of the outline of the flow of the method of manufacturing the TFT substrate.
Figure 7:
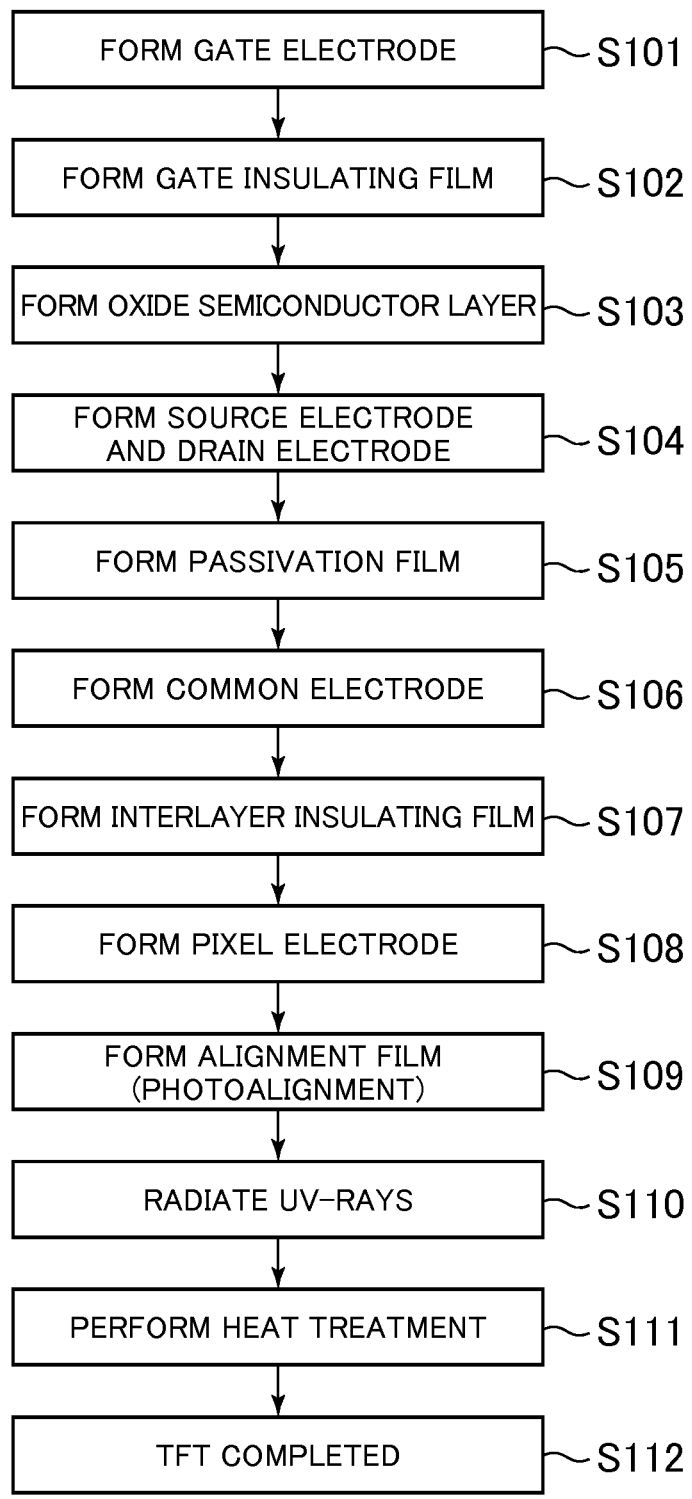
FIG. 7 illustrates an example of the outline of the flow of the method of manufacturing the TFT substrate.

Lastly, as illustrated in FIG. 6K, the oxide semiconductor 201 that has been irradiated with UV-rays is subjected to heat treatment (annealing treatment) (S111). Consequently, the TFT substrate 102 (TFT array) is completed (S112). Subsequently, the display device 100 is manufactured by bonding together the filter substrate 101 and the TFT substrate 102 in a known manner.

Figure 8:
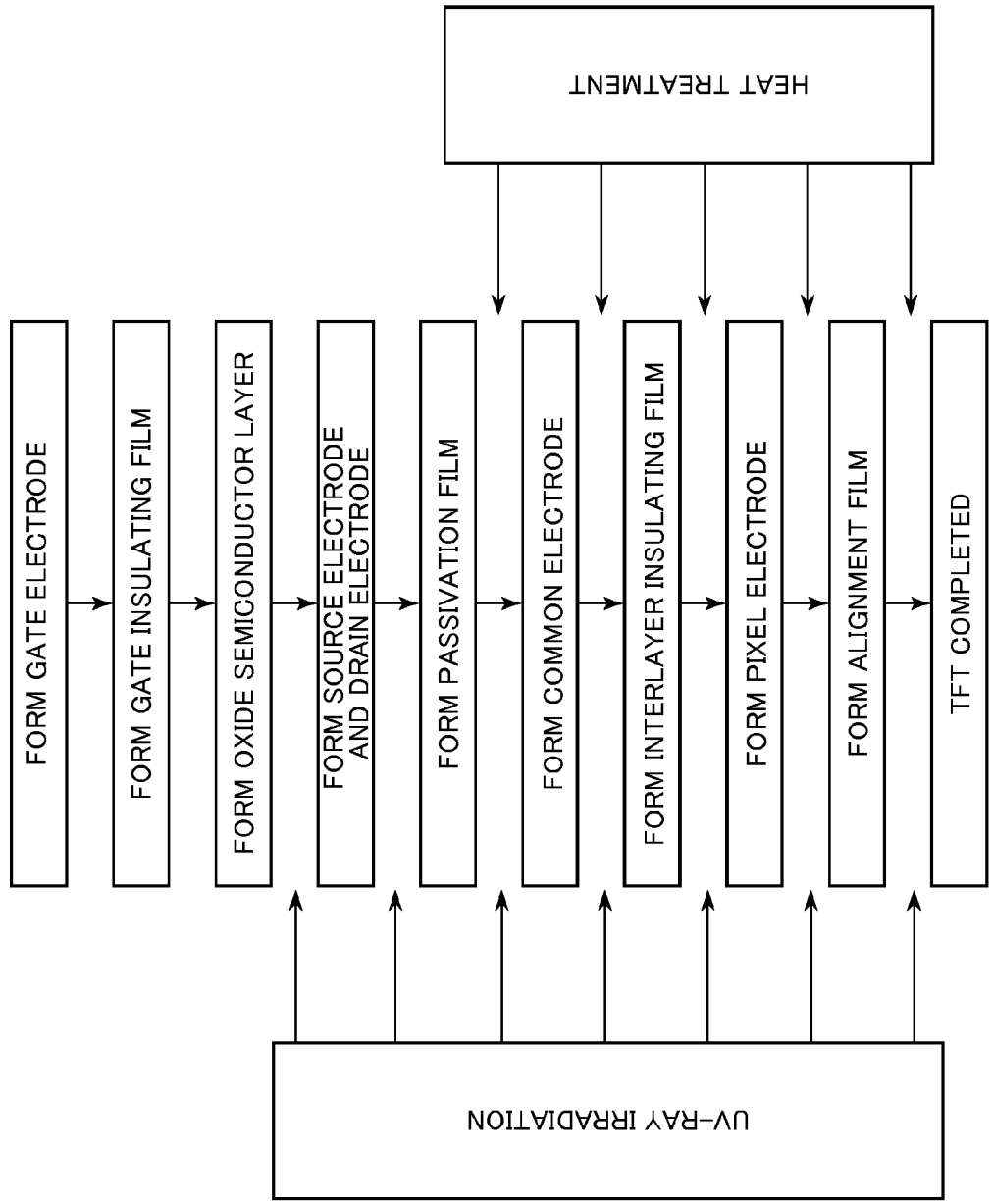
FIG. 8 illustrates another example of the flow of the method of manufacturing the TFT substrate.

Note that, this embodiment is not limited to the above-mentioned flow, which is described here as an example, of the method of manufacturing the TFT substrate 102. Specifically, for example, as illustrated in FIG. 8, the UV-ray irradiation of Step S110 may be carried out at a different stage, as long as this step is performed after the formation of the oxide semiconductor layer 201. Further, the heat treatment of Step S111 may also be carried out at a different stage, as long as this step is performed after the above-mentioned UV-ray irradiation, and, after the formation of the passivation film 402.

Figure 9:
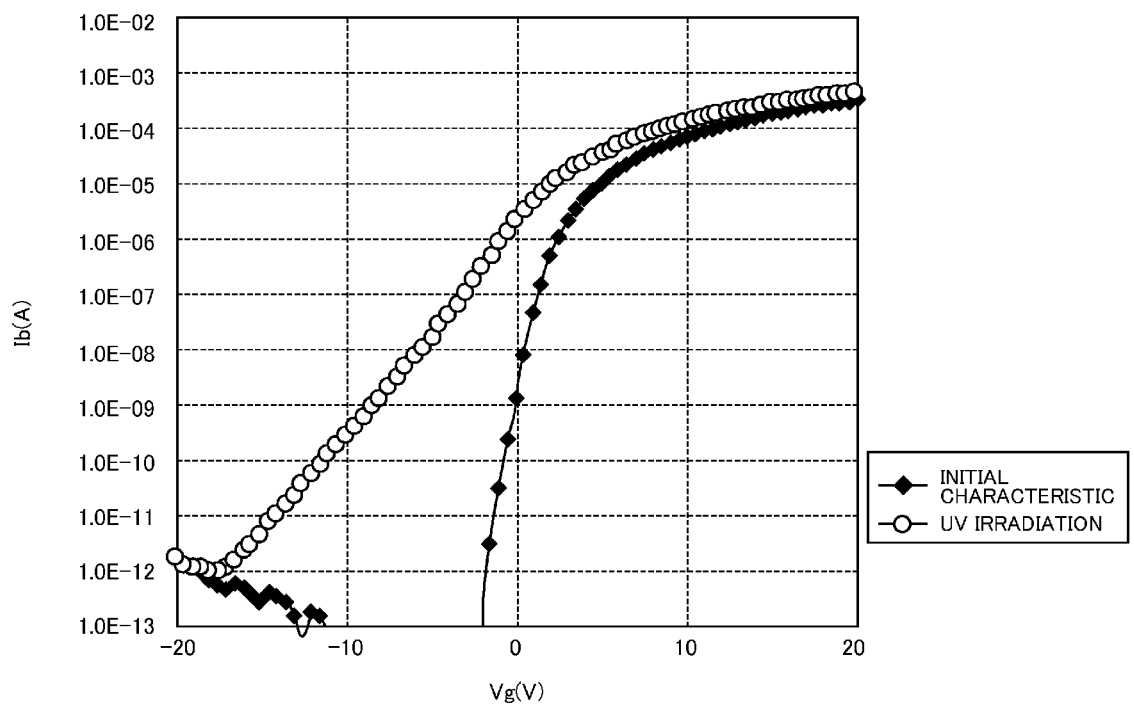
FIG. 9 shows an Id-Vg characteristic of the TFT.
Figure 10:
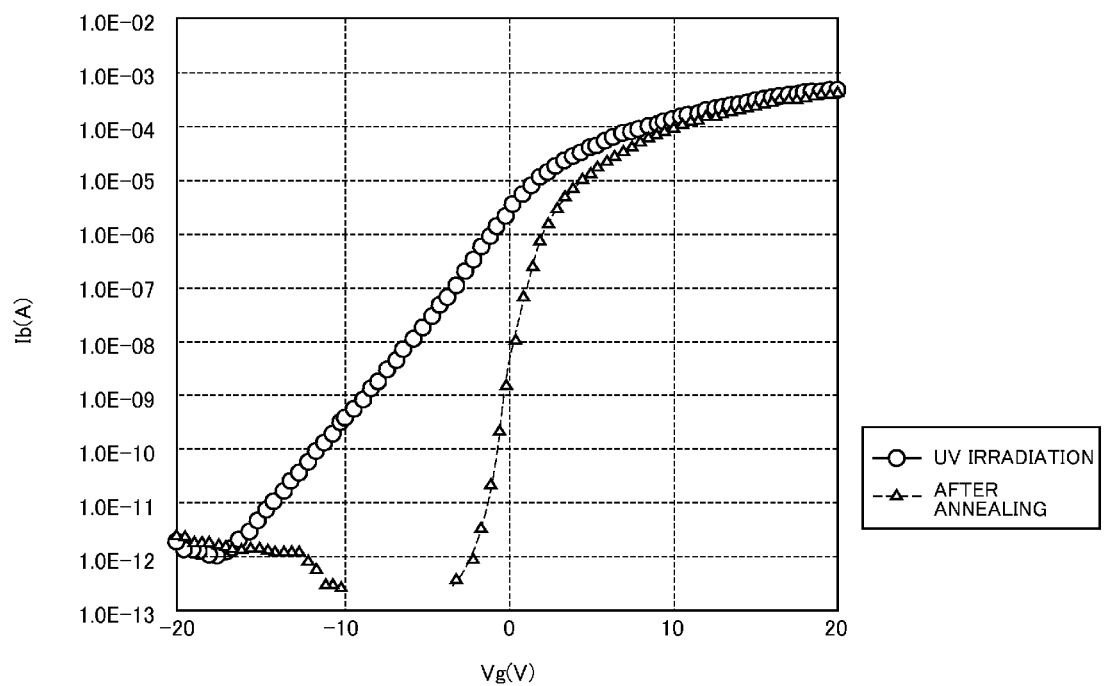
FIG. 10 shows an Id-Vg characteristic of the TFT.

Next, the characteristics of the ITT 109 manufactured according to this embodiment are described. FIGS. 9 and 10 show an Id-Vg characteristic of the TFT. Specifically, FIG. 9 shows a comparison of the Id-Vg characteristic of the TFT after UV-ray irradiation and the characteristic of the TFT before irradiation, and FIG. 10 shows a comparison of the Id-Vg characteristic of the TFT after UV-ray irradiation and the Id-Vg characteristic of the TFT after UV-ray irradiation subsequently followed by heat treatment.

As shown in FIG. 9, the UV-ray irradiation causes a threshold value of the TFT 109 to substantially shift, and the off current to increase. Note that, the characteristic after the UV-ray irradiation is irreversible, this characteristic is not restored over time. Further, FIG. 9 shows a case in which the irradiation of UV-rays is carried out at a level of 500 mJ after formation of the pixel electrode 110.

However, as shown in FIG. 10, by further carrying out heat treatment (annealing treatment) after the above-mentioned UV-ray irradiation, the Id-Vg characteristic is the same as the initial characteristic. In other words, by carrying out heat treatment, the characteristic is restored to the same level as the characteristic before the UV-ray irradiation. Note that, FIG. 10 shows a case in which the heat treatment is carried out at 250° C.

Figure 11:
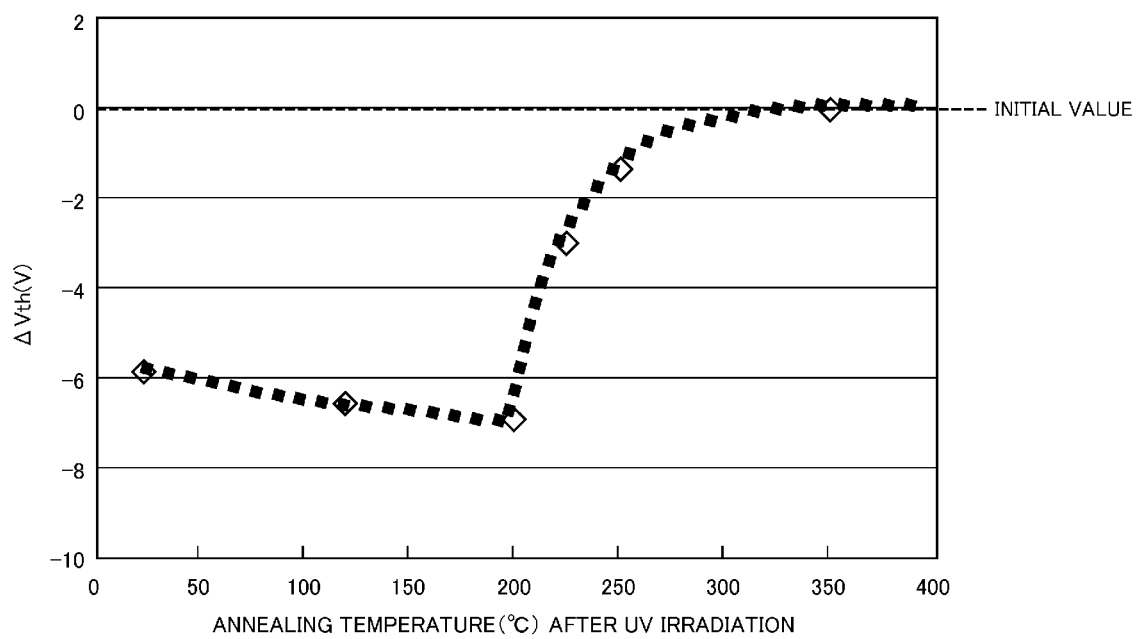
FIG. 11 shows a relationship between a shift in a threshold voltage of the TFT after UV-ray irradiation and a heat treatment temperature.

Next, a relationship between a shift in a threshold voltage of the TFT after UV-ray irradiation and a heat treatment temperature is described with reference to FIG. 11. In FIG. 11, the vertical axis represents the shift in the threshold value, and the horizontal axis represents the heat treatment temperature. As can be seen from FIG. 11, the TFT characteristics are suddenly restored when the heat treatment is carried out at 200° C. or more. Therefore, it is desired that the heat treatment be carried out at 200° C. or more. Further, as shown in FIG. 11, at 400° C. or more, the restoration of the characteristic flattens off. Further, carrying out the heat treatment at 400° C. or more may also cause defects to occur in the display device, such as deformation of the substrate 400. Therefore, it is desired that the heat treatment be carried out at 200° C. or more and 400° C. or less. Note that, the heat treatment is carried out in units of, for example, 10 minutes to 60 minutes.

Next, a relationship between an annealing temperature of the display device according to this embodiment and a shift in the threshold voltage is further described with reference to FIGS. 12A and 12B. FIGS. 12A and 12B show this relationship for a case in which light from a 10,000 cd/cm$^2$ backlight unit is radiated from the rear surface under the measurement environment of 60° C., a gate applied voltage of ±30 V, a source/drain applied voltage of 0 V, and an optical bias stress application time of 3,600 s. Note that, FIG. 12A shows a case in which the gate applied voltage is +30 V, and FIG. 12B shows a case in which the gate applied voltage is −30 V. Further, each of FIGS. 12A and 12B shows a case in which 500 mJ of UV-rays are radiated after formation of the pixel electrode 110. As shown in FIGS. 12A and 12B, it can be seen that when the heat treatment is carried out at from 200° C. to 400° C., a shift in the threshold voltage of the TFT 109 can be substantially suppressed.

Figure 13A:
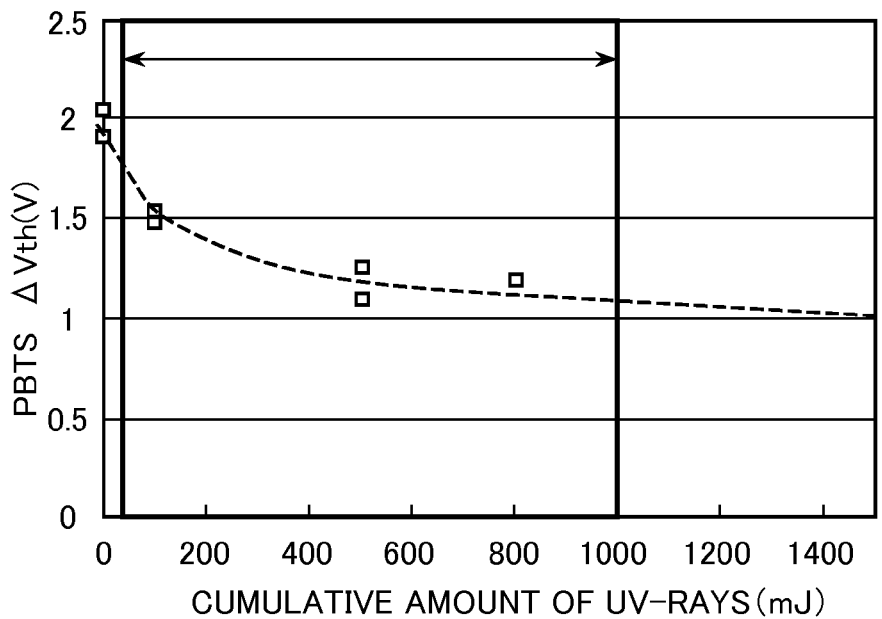
FIG. 13A shows a relationship between a shift in a threshold voltage of the TFT and a cumulative amount of UV-rays.
Figure 13B:
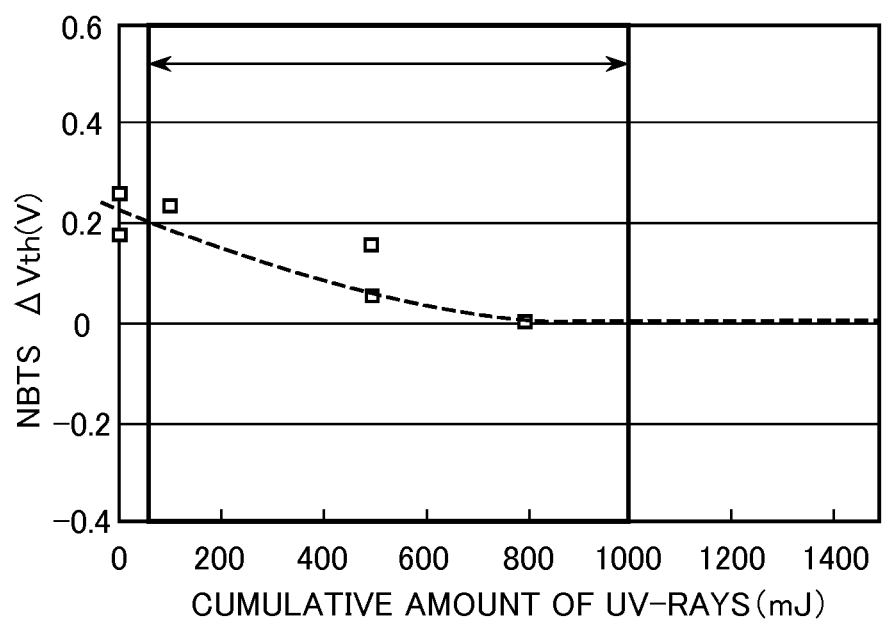
FIG. 13B shows a relationship between a shift in a threshold voltage of the TFT and a cumulative amount of UV-rays.

Next, a relationship between a shift in the threshold voltage and a cumulative amount of UV-rays is described with reference to FIGS. 13A and 13B. FIGS. 13A and 13B each show a case in which heat treatment is carried out at 250° C. after formation of the pixel electrode 110. Note that, the measurement environment is the same as the measurement environment in FIGS. 12A and 12B, and hence a description thereof is omitted here.

As shown in FIGS. 13A and 13B, when the cumulative amount of UV-rays is small, there is no reduction in the shift in the threshold voltage. Further, when the cumulative amount of UV-rays is large, the reduction effect levels off. In other words, the shift in the threshold voltage may be reduced when the cumulative amount of UV-rays is in the range of from 50 mJ to 1,000 mJ.

Figure 14:
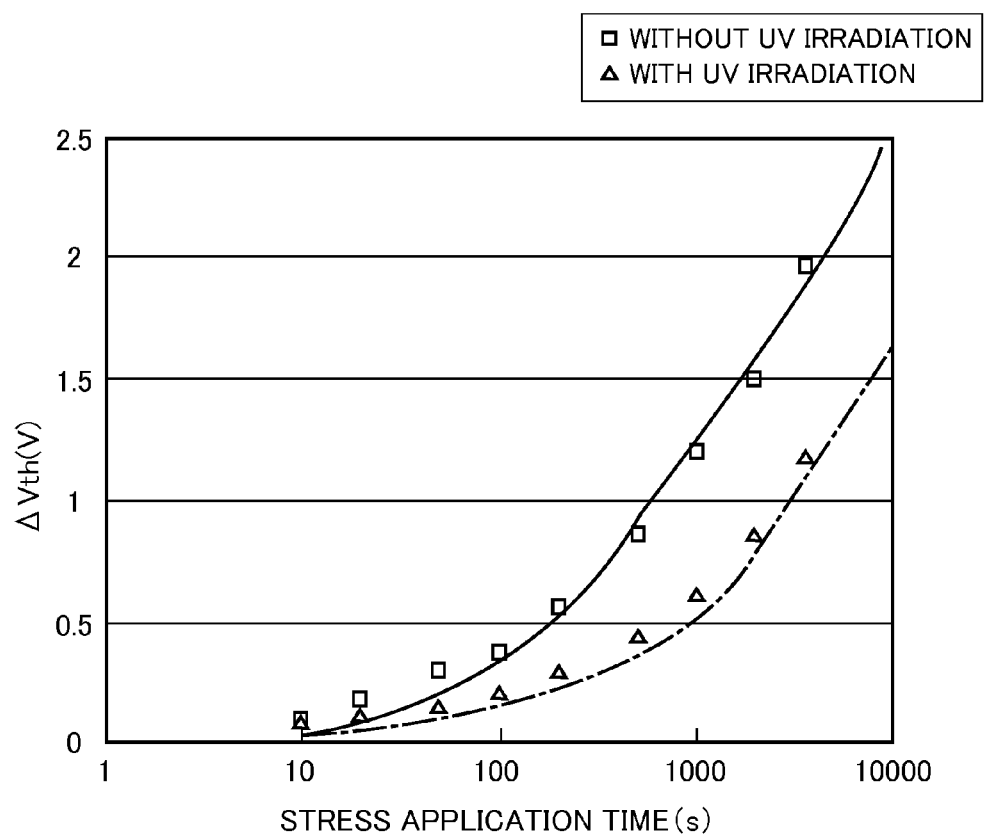
FIG. 14 shows a relationship between a shift in a threshold voltage of the TFT and a stress application time.

Next, a relationship between a shift in the threshold voltage of the TFT and a stress application time is described with reference to FIG. 14. FIG. 14 shows this relationship for a case in which light from a 10,000 cd/cm$^2$ backlight unit is radiated from the rear surface under the measurement environment of 60° C., a gate applied voltage of ±30 V, and a source/drain applied voltage of 0 V. Further, FIG. 14 shows a case in which UV-ray irradiation is carried out with an irradiation amount of 500 mJ after formation of the pixel electrode 110, and then heat treatment is carried out for 40 minutes at 250° C. As shown in FIG. 14, according to this embodiment, the shift in the threshold voltage can be suppressed more than for a TFT subjected to heat treatment without performing UV-ray irradiation.

As described above, according to this embodiment, TFT characteristics can be stabilized and the shift of the threshold voltage can be reduced when light is radiated. Specifically, in addition to a defect level localized for each process, a defect level caused by the UV-ray irradiation emerges. However, by subsequently performing the heat treatment, oxygen in the oxide films (passivation film 402, gate insulating film 401, etc.) moves, thereby reducing the defect level caused by oxygen deficiency. Consequently, the shift in the threshold voltage of the TFT can be reduced under optical bias stress conditions, enabling improved reliability of the display device and a longer life.

The present invention is not limited to the embodiment described above, and various modifications may be made thereto. The structure described in the embodiment may be replaced by substantially the same structure, a structure having the same action and effect, and a structure that may achieve the same object.

Figure 15:
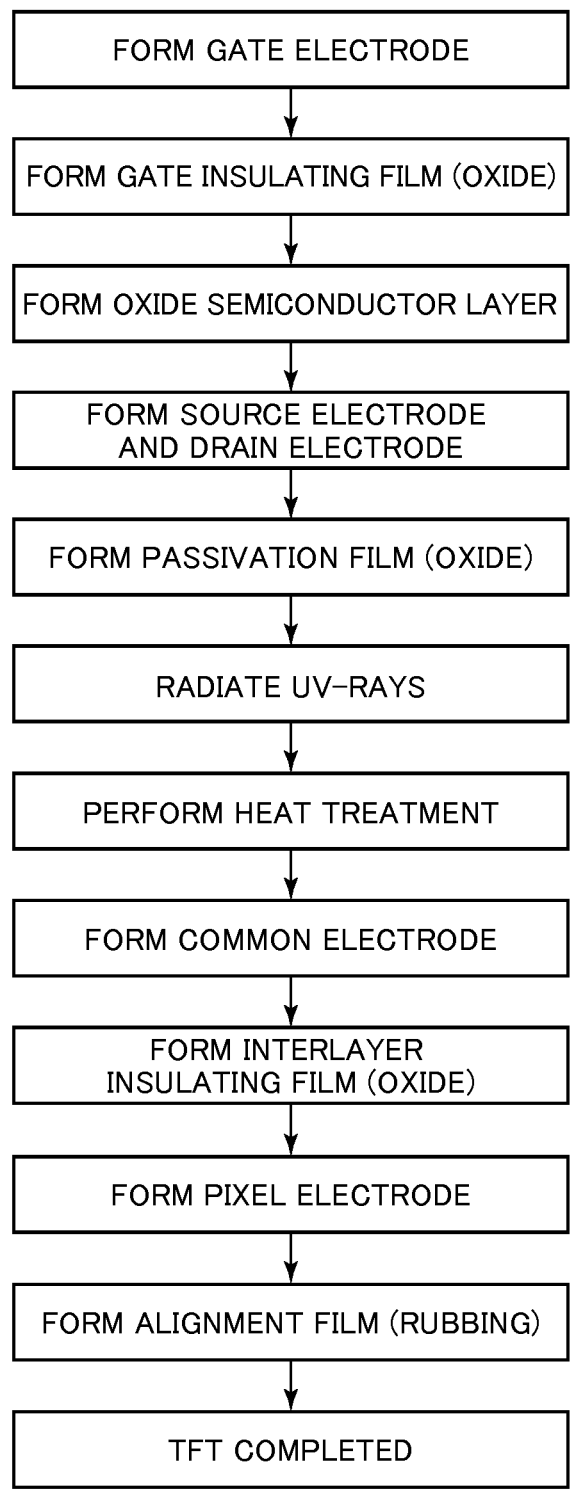
FIG. 15 illustrates another example of the flow of the method of manufacturing the TFT substrate.

For example, although a case is mainly described above in which the UV-ray irradiation and the heat treatment are performed after formation of the alignment film 404 by photoalignment, as illustrated in FIG. 15, the UV-ray irradiation and the heat treatment may be performed after forming the passivation film 402. In this case, regarding the UV-ray irradiation and the heat treatment, the heat treatment is performed by utilizing the annealing treatment of the passivation film 402. Consequently, there is no need to perform an independent heat treatment step, which enables the manufacturing process to be simplified.

Figure 16:
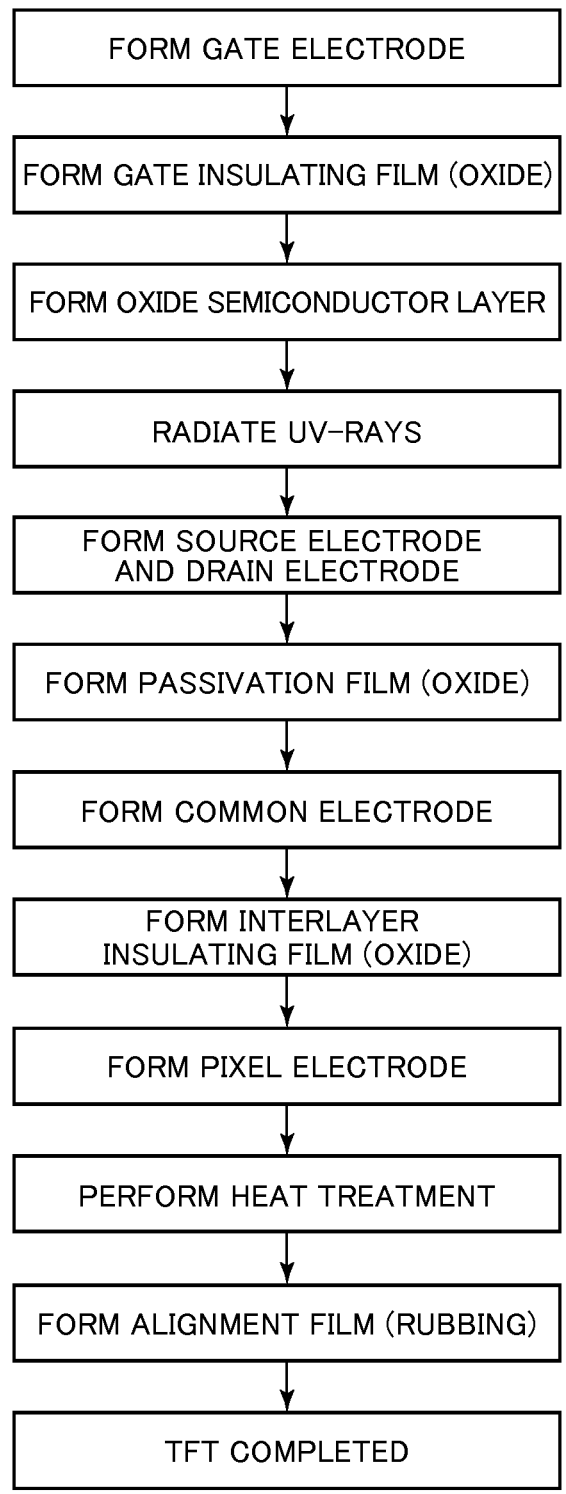
FIG. 16 illustrates another example of the flow of the method of manufacturing the TFT substrate.

Further, as illustrated in FIG. 16, the UV-ray irradiation may be performed after forming the oxide semiconductor 201 layer, and the heat treatment may be performed after forming the pixel electrode 110. In this case, the heat treatment is performed by utilizing the heat treatment carried out during the baking process of the pixel electrode 110. Consequently, there is no need to perform an independent heat treatment step, which enables the manufacturing process to be simplified.

Note that, in the processes illustrated in FIGS. 15 and 16, the UV-ray irradiation utilizing photoalignment processing is not carried out in the above-mentioned embodiment, and hence a so-called rubbing process is used for forming the alignment film 404. However, photoalignment may also be used to form the alignment film 404 in these cases. However, in such a case, heat treatment is again performed in order to restore the characteristics of the TFT 109.

Figure 17:
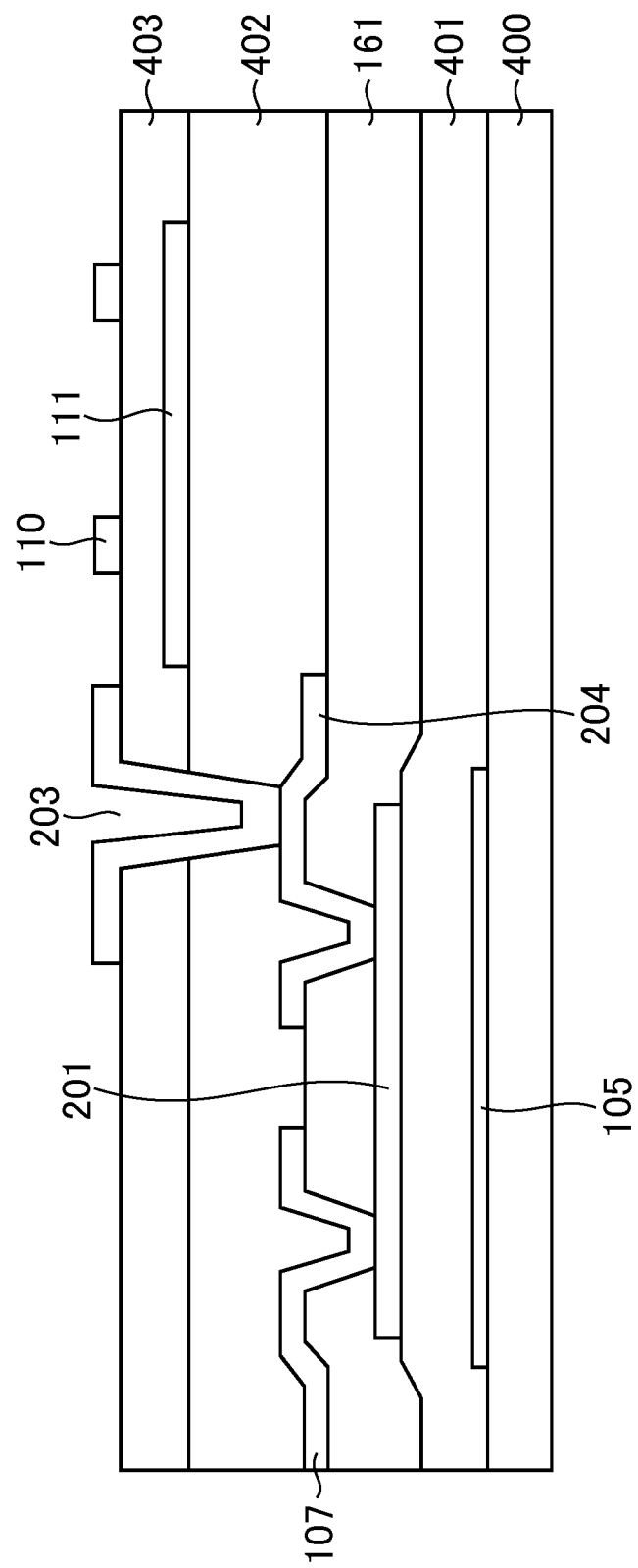
FIG. 17 illustrates another example of the configuration of the display device.

In addition, although a case is described above in which a so-called channel edge-type TFT 109 is formed as illustrated in FIG. 4, one or more embodiments of the present invention may also be applied in a case in which a channel edge stopper-type TFT is formed as illustrated in FIG. 17. In this case, a channel edge stopper film 161 is formed on an oxide semiconductor layer 201 as illustrated in FIG. 17, and then the source/drain electrode 107 is formed. Note that, $SiO_2$, for example, is used as the material of the channel edge stopper film 161. The other points regarding this TFT are the same as in the above-mentioned embodiment, and hence a description thereof is omitted here.

What is claimed is:

1. A method of manufacturing a display device, comprising:
    forming a gate electrode on a substrate;
    forming a gate insulating film on the substrate having the gate electrode formed thereon;
    forming an oxide semiconductor on the substrate having the gate insulating film formed thereon;
    forming a source electrode and a drain electrode on the substrate having the oxide semiconductor formed thereon;
    forming a passivation film on the substrate having the source electrode and the drain electrode formed thereon;
    forming a common electrode on the substrate having the passivation film formed thereon;
    forming an interlayer insulating film on the substrate having the common electrode formed thereon;
    forming a pixel electrode on the substrate having the interlayer insulating film formed thereon;
    forming an alignment film on the substrate having the pixel electrode formed thereon;
    radiating UV-rays onto the oxide semiconductor;
    heat-treating the oxide semiconductor irradiated with the UV-rays; and
    bonding together the substrate and an opposing substrate opposing the substrate, wherein the radiating UV-rays is included in the forming an alignment film,
    the forming an alignment film is performed by photoalignment, and
    the radiating UV-rays and the heat-treating the oxide semiconductor are performed before the bonding together the substrate and an opposing substrate opposing the substrate.

2. The method of manufacturing a display device according to claim 1, wherein the heat-treating is performed at a temperature range from 200° C. to 400° C.

3. The method of manufacturing a display device according to claim 1, wherein the heat-treating the oxide semiconductor irradiated with the UV-rays is performed using the UV-rays having a wavelength of from 200 to 400 nm.

4. The method of manufacturing a display device according to claim 1, wherein the heat-treating the oxide semiconductor irradiated with the UV-rays is performed under a state in which a cumulative amount of the UV-rays is from 50 mJ to 1,000 mJ.

5. The method of manufacturing a display device according to claim 1, further comprising forming a channel protective film on the substrate having the oxide semiconductor formed thereon.

* * * * *